United States Patent
Yem (10) Patent No.: US 9,608,621 B1
(45) Date of Patent: Mar. 28, 2017

(54) POWER ON RESET CIRCUIT, POWER ON RESET METHOD AND ELECTRIC DEVICE USING THE SAME

(71) Applicant: PIXART IMAGING (PENANG) SDN. BHD., Penang (MY)

(72) Inventor: Poh-Weng Yem, Penang (MY)

(73) Assignee: PIXART IMAGING (PENANG) SDN. BHD., Penang (MY)

( * ) Notice: Subject to any disclaimer, the term of this patent is extended or adjusted under 35 U.S.C. 154(b) by 0 days.

(21) Appl. No.: 14/855,452

(22) Filed: Sep. 16, 2015

(51) Int. Cl.
  *H03L 7/00* (2006.01)
  *H03K 17/22* (2006.01)
  *H03K 5/1534* (2006.01)

(52) U.S. Cl.
  CPC ......... *H03K 17/223* (2013.01); *H03K 5/1534* (2013.01)

(58) Field of Classification Search
  CPC .................................................. H03K 17/223
  See application file for complete search history.

(56) References Cited

U.S. PATENT DOCUMENTS

2007/0001721 A1\* 1/2007 Chen ................... H03K 17/223
                                                                  327/143

\* cited by examiner

*Primary Examiner* — Daniel Puentes
(74) *Attorney, Agent, or Firm* — Li & Cai Intellectual Property (USA) Office (57) ABSTRACT

Disclosed are a power on reset circuit, a power on reset method and an electric device using the same. In the power on reset circuit and method, a first voltage detecting circuit and a second voltage detecting circuit detect the voltage of a power supply and output a first voltage signal and a second voltage signal respectively. A logic circuit receives the first voltage signal and the second voltage signal to turn no or off the first voltage detecting circuit for detecting the voltage of the power supply. Specifically, merely when the voltage value of the power supply is less than a rising threshold voltage value of the first voltage detecting circuit or a falling threshold voltage value of the second voltage detecting circuit, the first voltage detecting circuit is turned on to detect the voltage value of the power supply.

18 Claims, 5 Drawing Sheets

POWER ON RESET CIRCUIT, POWER ON RESET METHOD AND ELECTRIC DEVICE USING THE SAME

BACKGROUND OF THE INVENTION

1. Field of the Invention

The instant disclosure relates to a power on reset circuit, a power on reset method and an electric device using the same; in particular, to a power on reset circuit that can be shut down or turned on automatically, and its corresponding power on reset method and an electric device using the same.

2. Description of Related Art

Figure 1A:
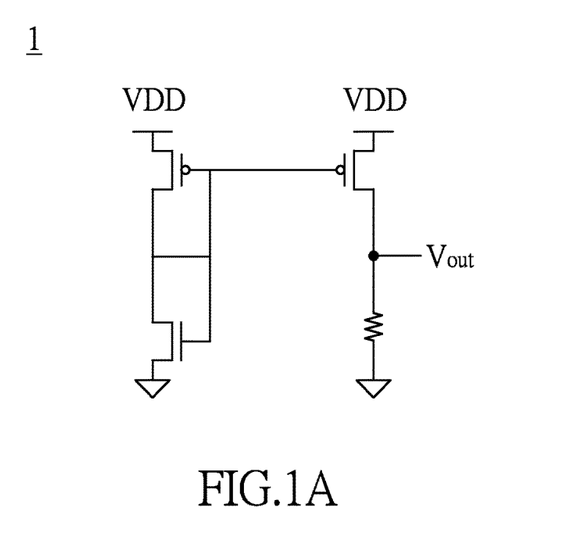
FIG. 1A shows a schematic diagram of a traditional power on reset circuit.
Figure 1B:
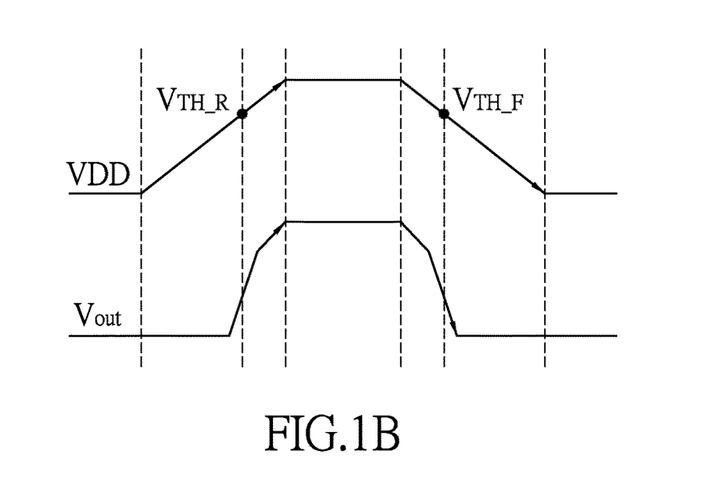
FIG. 1B shows a schematic diagram representing the output voltage of the traditional power on reset circuit shown in FIG. 1A.

As known, the power on reset circuit is usually used to detect the rising and falling of the voltage of a power supply for an electric device. In conjunction with FIG. 1A and FIG. 1B, FIG. 1A shows a schematic diagram of a traditional power on reset circuit, and FIG. 1B shows a schematic diagram representing the output voltage of the traditional power on reset circuit shown in FIG. 1A. As shown in FIG. 1A and FIG. 1B, the power on reset circuit 1 has a rising threshold voltage $V_{TH\_R}$ and a falling threshold voltage $V_{TH\_F}$. As the power supply starts to provide power to the electric device butt the voltage of the power supply has not yet reached to the rising threshold voltage $V_{TH\_R}$, the power on reset circuit 1 starts to detect the voltage of the power supply VDD and outputs an output signal $V_{OUT}$ at low level, which represents that the entire circuit of the electric device is in its reset status. As the voltage of the power supply VDD reaches to the rising threshold voltage $V_{TH\_R}$, the power on reset circuit 1 outputs an output signal $V_{OUT}$ at high level, which represents that the electric device has been turned on; however, the power on reset circuit 1 continually detects the voltage of the power supply VDD. After a period of time, as the voltage of the power supply VDD falls to be less than the falling threshold voltage $V_{TH\_F}$, an output signal $V_{OUT}$ output by the power on reset circuit 1 turns to be at low level, which represents that the entire circuit of the electric device has returned to it reset status.

However, after the voltage of the power supply becomes stable and the electric device is turned on, the power on reset circuit 1 shown by FIG. 1A and FIG. 1B would continually detect the voltage of the power supply VDD, which thus results in the unnecessary power consumption.

SUMMARY OF THE INVENTION

The instant disclosure provides a power on reset circuit, and the power on reset circuit comprises a first voltage detecting circuit, a second voltage detecting circuit and a logic circuit. The first voltage detecting circuit is configured to detect the voltage value of a power supply and to output a first voltage signal as an output signal of the power on reset circuit. The second voltage detecting circuit is configured to detect the voltage value of the power supply and to output a second voltage signal. The logic circuit is electrically connected to the first voltage detecting circuit and the second voltage detecting circuit. The logic circuit is configured to receive the first voltage signal and the second voltage signal, and to generate a control signal according to the first voltage signal and the second voltage signal. The control signal is used to turn on or off the first voltage detecting circuit so as to detect the voltage value of the power supply. Especially, merely when the voltage value of the power supply is less than a rising threshold voltage value of the first voltage detecting circuit or a falling threshold voltage value of the second voltage detecting circuit, the first voltage detecting circuit is turned on to detect the voltage value of the power supply.

The instant disclosure also provides a power on reset method used in a power on reset circuit. The power on reset circuit comprises a first voltage detecting circuit, a second voltage detecting circuit and a logic circuit, wherein the logic circuit is electrically connected to the first voltage detecting circuit and the second voltage detecting circuit. The power on reset method comprises steps as follows: detecting a voltage value of a power supply via the first voltage detecting circuit and outputting a first voltage signal as an output signal of the power on reset circuit; detecting the voltage value of the power supply via the second voltage detecting circuit and outputting a second voltage signal; and receiving the first voltage signal and the second voltage signal via the logic circuit, and generating a control signal according to the receive first voltage signal and second voltage signal, wherein the control signal is used to turn on or off the first voltage detecting circuit so as to detect the voltage value of the power supply. Especially, merely when the voltage value of the power supply is less than a rising threshold voltage value of the first voltage detecting circuit or a falling threshold voltage value of the second voltage detecting circuit, the first voltage detecting circuit is turned on to detect the voltage value of the power supply.

The instant disclosure further provides an electric device comprising a plurality of circuits, wherein at least one of the circuits is a power on reset circuit.

To sum up, in the power on reset circuit, the power on reset method and the electric device using the same provided by the embodiments of the instant disclosure, the logic circuit controls the first voltage detecting circuit and the second voltage detecting circuit such that the first voltage detecting circuit is turned on to detect the voltage of the power supply merely when the voltage of the power supply is less than the rising threshold voltage of the first voltage detecting circuit or the falling threshold voltage of the second voltage detecting circuit. In other words, in the power on reset circuit, the power on reset method and the electric device using the same provided by the embodiments of the instant disclosure, as the voltage of the power supply has been larger than the rising threshold voltage of the first voltage detecting circuit, the first voltage detecting circuit would automatically stop detecting the voltage of power supply. The first voltage detecting circuit would automatically start again to detect the voltage of power supply when the voltage of the power supply is less than the falling threshold voltage of the second voltage detecting circuit. Comparing with the traditional power on reset circuit that needs to stay alive all time to detect the voltage of the power supply, the instant disclosure reduces the power consumption and thus the operation cost of the electric device can be further decreased.

For further understanding of the instant disclosure, reference is made to the following detailed description illustrating the embodiments and examples of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings. In the drawings, the size and relative sizes of layers and regions may be exaggerated for clarity.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the instant disclosure. As used herein, the term "and/or" includes any and all combinations of one or more of the associated listed items.

In the following description, there are embodiments for illustrating the power on reset circuit, the power on reset method and the electric device using the same, but not for restricting the instant disclosure.

[One Embodiment of the Power on Reset Circuit]

Figure 2:
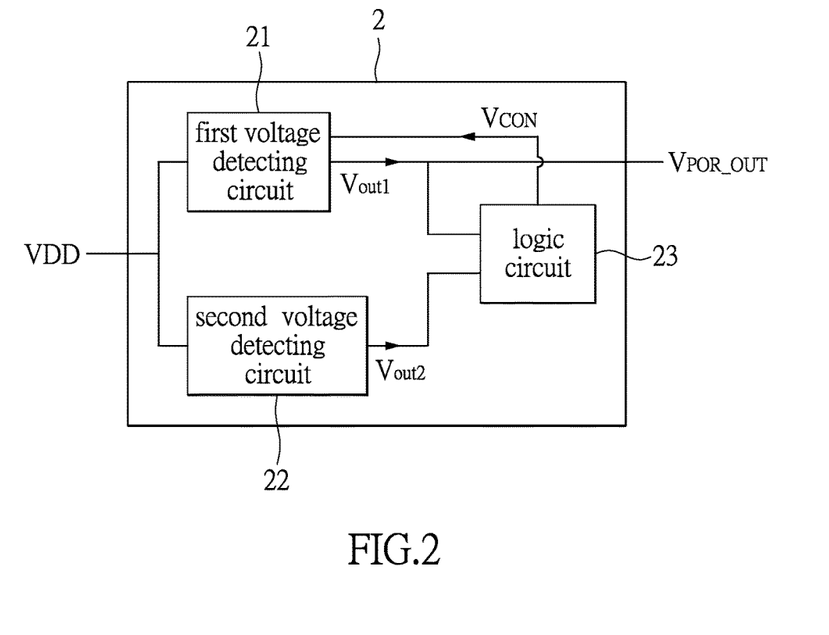
FIG. 2 shows a block diagram of a power on reset circuit of one embodiment of the instant disclosure.
Figure 3:
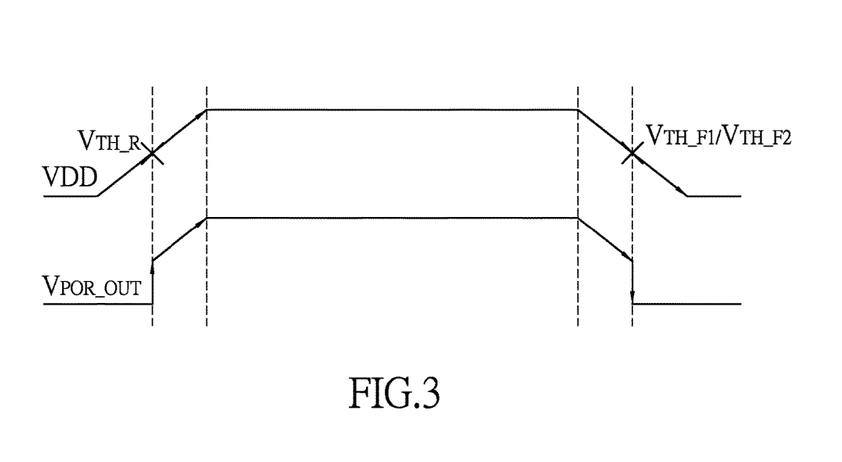
FIG. 3 shows a schematic diagram representing the output voltage of the power on reset circuit shown in FIG. 2.

In conjunction with FIG. 2 and FIG. 3, FIG. 2 shows a block diagram of a power on reset circuit of one embodiment of the instant disclosure, and FIG. 3 shows a schematic diagram representing the output voltage of the power on reset circuit shown in FIG. 2.

As shown in FIG. 2, the power on reset circuit 2 in this embodiment comprises a first voltage detecting circuit 21, a second voltage detecting circuit and a logic circuit 23. The first voltage detecting circuit 21 and the second voltage detecting circuit 22 are both electrically connected to the power supply VDD and the logic circuit 23. The first voltage detecting circuit 21 is configured to detect the voltage of the power supply VDD and to output a first voltage signal $V_{OUT1}$ as an output signal $V_{POR\_OUT}$ of the power on reset circuit 2. The second voltage detecting circuit 22 is also configured to detect the voltage of the power supply VDD and to output a second voltage signal $V_{OUT2}$. The logic circuit 23 is configured to receive the first voltage signal $V_{OUT1}$ and the second voltage signal $V_{OUT2}$, and to generate a control signal $V_{CON}$ according to the received first voltage signal $V_{OUT1}$ and the second voltage signal $V_{OUT2}$. The control signal $V_{CON}$ is to turn on or off the first voltage detecting circuit 21 for detecting the voltage of the power supply VDD.

It is worth noticing that, in this embodiment, the first voltage detecting circuit 21 has a rising threshold voltage $V_{TH\_R}$ and the second voltage detecting circuit 22 has a falling threshold voltage $V_{TH\_F2}$. As shown in FIG. 2 and FIG. 3, as the power supply VDD starts to provide power to an electric device, the power on reset circuit 2 starts to detect the voltage of the power supply VDD. Before the voltage of the power supply VDD reaches to the rising threshold voltage $V_{TH\_R}$, the power on reset circuit 2 outputs an output signal $V_{POR\_OUT}$ at low level, which represents that the entire circuit of the is in a reset status. As the voltage of the power supply VDD increases and reaches to the rising threshold voltage $V_{TH\_R}$ of the first voltage detecting circuit 21, the first voltage detecting circuit 2 outputs an output signal $V_{POR\_OUT}$ at high level, which represents that the reset status of the electric device is ended and the electric device is substantially turned on. At the same time, the logic circuit 23 in the power on reset circuit 23 generates a control signal $V_{CON}$ for shutting down the first voltage detecting circuit according to the first voltage signal $V_{OUT1}$ generated by the first voltage detecting circuit 21 and the second voltage signal $V_{OUT2}$ generated by the second voltage detecting circuit 22, which further makes the power on reset circuit stop detecting the voltage of the power supply VDD. On the other hand, as the voltage of the power supply VDD gradually decreases from a value of its steady state to the falling threshold voltage $V_{TH\_F2}$ of the second voltage detecting circuit 22, the output signal $V_{POR\_OUT}$ output by the power on reset circuit 2 would be turned from a high level one to a low level one, which represents that the entire circuit of the electric device is switched back to the reset status. At the same time, the logic circuit 23 would generate a control signal $V_{CON}$ according to the first voltage signal $V_{OUT1}$ generated by the first voltage detecting circuit 21 and the second voltage signal $V_{OUT2}$ generated by the second voltage detecting circuit 22 for turning on the first voltage detecting circuit 21 and further making the power on reset circuit 2 again start to detect the voltage of the power supply VDD.

In other words, merely when the voltage of the power supply VDD is less than the rising threshold voltage $V_{TH\_R}$ of the first voltage detecting circuit 21 or the falling threshold voltage $V_{TH\_F2}$ of the second voltage detecting circuit 22, the first voltage detecting circuit 21 would be turned on, which further makes the power on reset circuit 2 detect the voltage of the power supply VDD.

The following description is to further teach about working mechanism of the power on reset circuit 2 provided by the embodiment shown in the FIG. 2. For ease of explanation, in this embodiment the first voltage detecting circuit 21 is a rising and falling edge detecting circuit for detecting whether the voltage of the power supply VDD rises or falls, and the second voltage detecting circuit 22 is a falling edge detecting circuit for detecting whether the voltage of the power supply VDD falls; however, it is not limited herein. The first voltage detecting circuit 21 has a rising threshold voltage $V_{TH\_R}$ and a falling threshold voltage $V_{TH\_F1}$, and the second voltage detecting circuit 22 has a falling threshold voltage $V_{TH\_F2}$. It should be mentioned that, the scales of the falling threshold voltage $V_{TH\_F1}$ of the first voltage detecting circuit 21 and the falling threshold voltage $V_{TH\_F2}$ of the second voltage detecting circuit 22 are not restricted, either. That is, the falling threshold voltage $V_{TH\_F1}$ of the first voltage detecting circuit 21 may be larger than, equal to or less than the falling threshold voltage $V_{TH\_F2}$ of the second voltage detecting circuit 22, which is further described in the following description.

Figure 4:
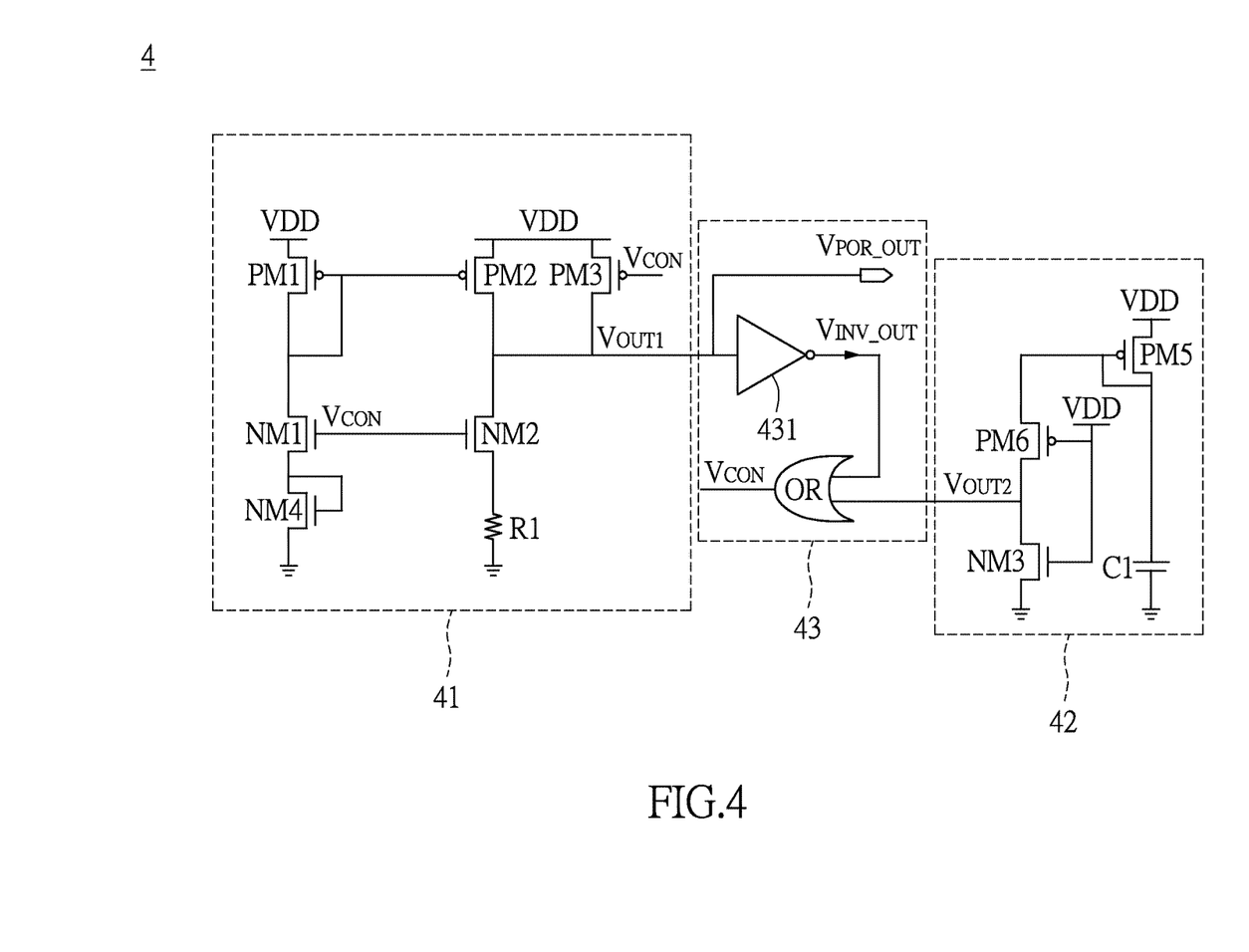
FIG. 4 shows a schematic diagram of a power on reset circuit of one embodiment of the instant disclosure.

For ease of explaining the circuit structure and the detailed working mechanism of the power on reset circuit provided by this embodiment of the instant disclosure, please refer to FIG. 4, FIG. 4 shows a schematic diagram of a power on reset circuit of one embodiment of the instant disclosure. As mentioned, in this embodiment, the power on reset circuit 4 comprises a first voltage detecting circuit 41, a second voltage detecting circuit 42 and a logic circuit 43. The first voltage detecting circuit 41 and the second voltage detecting circuit 42 are both electrically connected to the power supply VDD and the logic circuit 43.

As shown in FIG. 4, the logic circuit 43 comprises an inverter 431 and an OR gate. The inverter 431 comprises an input end and an output end, wherein the input end receives the first voltage signal $V_{OUT1}$ and the output end outputs a first inversing voltage signal $V_{INV\_OUT}$. The OR gate comprises a first input end, a second input end and an output end, wherein the first input end is electrically connected to the output end of the inverter for receiving the first inversing voltage signal $V_{INV\_OUT}$, and second input end is electrically connected to the second voltage detecting circuit 42 for receiving the second voltage signal $V_{OUT2}$ and the output end is electrically connected to the first voltage detecting circuit 41 for outputting a control signal $V_{CON}$ to turn on or off the first voltage detecting circuit 41 for detecting the voltage of the power supply VDD.

The first voltage detecting circuit 41 comprises a first PMOS transistor PM1, a second PMOS transistor PM2, a first NMOS transistor NM1, a resistor R1, a second NMOS transistor NM2, a fourth NMOS transistor NM4 and a third PMOS transistor PM3. The source of the first PMOS transistor PM1 is electrically connected to the power supply VDD, and the gate and the drain are electrically connected. The source of the second PMOS transistor PM2 is electrically connected to the power supply VDD, and the gate of the second PMOS transistor PM2 is electrically connected to the gate and the drain of the first PMOS transistor PM1. The source of the first NMOS transistor NM1 is electrically connected to the drain and the gate of the fourth NMOS transistor NM4, the source of the fourth NMOS transistor is grounded, the gate of the first NMOS transistor NM1 is electrically connected to the logic circuit 43 for receiving a control signal $V_{CON}$, and the drain of the first NMOS transistor NM1 is electrically connected to the drain of the first PMOS transistor PM1. The resistor R1 comprises a first end and a second end, wherein the second end is grounded. The source of the second NMOS transistor NM2 is electrically connected to the first end of the resistor R1, the gate of the second NMOS transistor NM2 is electrically connected to the logic circuit 43 for receiving the control signal $V_{CON}$, and the drain of the second NMOS transistor NM2 is electrically connected to the drain of the second PMOS transistor PM2 and the logic circuit for outputting a first voltage signal $V_{OUT1}$ to the logic circuit 43. The source of the third PMOS transistor PM3 is electrically connected to the power supply VDD, the gate of the third PMOS transistor PM3 is electrically connected to the logic circuit 43 for receiving the control signal $V_{CON}$, and the drain of the third PMOS transistor PM3 is electrically connected to the drain of the second PMOS transistor PM2 and the logic circuit 43 for outputting the first voltage signal $V_{OUT1}$ to the logic circuit 43.

The second voltage detecting circuit 42 comprises a fifth PMOS transistor PM5, a capacitor C1, a sixth PMOS transistor PM6 and a third NMOS transistor NM3. The source of the fifth PMOS transistor PM5 is electrically connected to the power supply VDD, and the drain and gate of the fifth PMOS transistor PM5 are electrically connected. The capacitor C1 comprises a first end and a second end, wherein the first end is electrically connected to the drain and gate of the fifth PMOS transistor PM5 and the second end is grounded. The source of the sixth PMOS transistor PM6 is electrically connected to the gate of the fifth PMOS transistor PM5, the gate of the sixth PMOS transistor PM6 is electrically connected to the power supply VDD, and the drain of the sixth PMOS transistor PM6 is electrically connected to the logic circuit 43 for outputting the second voltage signal $V_{OUT2}$ to the logic circuit 43. The source of the third NMOS transistor NM3 is grounded, the gate of the third NMOS transistor NM3 is electrically connected to the power supply VDD, and the drain of the third NMOS transistor NM3 is electrically connected to the drain of the sixth PMOS transistor PM6 and the logic circuit 43 for outputting the second voltage signal $V_{OUT2}$ to the logic circuit 43.

To be further, during a period that the voltage value of the power supply rises, as the voltage of the power supply VDD is less than the rising threshold voltage $V_{TH\_R}$ of the first voltage detecting circuit 41, the first voltage detecting circuit 41 and the second voltage detecting circuit 42 respectively output a first voltage signal $V_{OUT1}$ and a second voltage signal $V_{OUT2}$ at low level to the logic circuit 43.

Specifically, as shown in FIG. 4, after the input end of the inverter 431 in the logic circuit 43 receives the first voltage signal $V_{OUT1}$ at low level, the inverter 431 outputs a first inversing voltage signal $V_{INV\_OUT}$ at high level to the first input end of the OR gate. After that, the first input end of the OR gate receives the first inversing voltage signal $V_{INV\_OUT}$ at high level, the second input end of the OR gate receives the second voltage signal $V_{OUT2}$ at low level, and thus the output end of the OR gate outputs a control signal $V_{CON}$ at high level for turning off the third PMOS transistor PM3 in the first voltage detecting circuit 41 and turning on the first NMOS transistor NM1 and the second NMOS transistor NM2 in the first voltage detecting circuit 41. In other words, the first voltage detecting circuit 41 is turned on and the first voltage detecting circuit 4 is detecting the voltage of the power supply VDD. Moreover, the first voltage signal $V_{OUT1}$ output by the first voltage detecting circuit 41 is at low level, so the output signal $V_{POR\_OUT}$ output by the power on reset circuit 4 is also at low level, which represents that the entire circuit of the electric device is still in a reset status.

After that, as the voltage of the power supply VDD is larger than or equal to the rising threshold voltage $V_{TH\_R}$ of the first voltage detecting circuit 41, the first voltage signal $V_{OUT1}$ output by the first voltage detecting circuit 41 would turn to be at high level and the second voltage signal $V_{OUT2}$ output by the second voltage detecting circuit 42 is stay at low level.

Specifically, as shown in FIG. 4, after the input end of the inverter 431 in the logic circuit 43 receives the first voltage signal $V_{OUT1}$ at high level, the output end of the inverter 431 outputs the first inversing voltage signal $V_{INV\_OUT}$ at low level to the first input end of the OR gate. After that, the first input end of the OR gate receives the first inversing voltage signal $V_{INV\_OUT}$ at low level and the second input end receives the second voltage signal $V_{OUT2}$ at low level, and thus the output end of the OR gate outputs a control signal $V_{CON}$ at low level for turning off the first NMOS transistor NM1 and the second NMOS transistor NM2 in the first voltage detecting circuit 41 and turning on the third PMOS transistor PM3 in the first voltage detecting circuit 41. In other words, the first voltage detecting circuit 41 is turned off such that the power on reset circuit 4 stops detecting the voltage of the power supply VDD. At the same time, because the third PMOS transistor PM3 is turned on, the first voltage signal $V_{OUT1}$ would stay at high level such that the output signal $V_{POR\_OUT}$ output by the power on reset circuit 4 would turn to be at high level, which represents that the reset status of the electric device is ended and the electric device has been turned on.

The following description illustrating the situation that the falling threshold voltage of the first voltage detecting circuit is larger than the falling threshold voltage of the second voltage detecting circuit. If the voltage of the power supply VDD falls from its steady state, during a period that the voltage value of the power supply falls, as the voltage of the power supply VDD is still larger than the falling threshold voltage $V_{TH\_F1}$ of the first voltage detecting circuit 41, the first voltage signal $V_{OUT1}$ output by the first voltage detecting circuit 41 stays at high level and the second voltage signal $V_{OUT2}$ output by the second voltage detecting circuit 42 stays at low level.

Specifically, as shown in FIG. 4, after the input end of the inverter 431 in the logic circuit 43 receives the first voltage signal $V_{OUT1}$ at high level, the output end of the inverter 431 outputs the first inversing voltage signal $V_{INV\_OUT}$ at low level to the first input end of the OR gate. After that, the first input end of the OR gate receives the first inversing voltage signal $V_{INV\_OUT}$ at low level and the second input end of the OR gate receives the second voltage signal $V_{OUT2}$ at low level such that the output end of the OR gate outputs the control signal $V_{CON}$ at low level for turning off the first NMOS transistor NM1 and the second NMOS transistor NM2 in the first voltage detecting circuit 41 and turning on the third PMOS transistor PM3 in the first voltage detecting circuit 41. In other words, the first voltage detecting circuit 41 is turned off such that the power on reset circuit 4 does not detect the voltage of the power supply VDD still. Also, because the third PMOS transistor PM3 is turned on, the first voltage signal $V_{OUT1}$ stays at high level such that the output signal $V_{POR\_OUT}$ of the power on reset circuit 4 also stays ay high level, which represents that the electric device is still turned on and operating.

After that, as the voltage of the power supply VDD falls and turns less than the falling threshold voltage $V_{TH\_F1}$ of the first voltage detecting circuit 42 but still larger than the falling threshold voltage $V_{TH\_F2}$ of the second voltage detecting circuit 42, the first voltage signal $V_{OUT1}$ output by the first voltage detecting circuit 41 would stay at high level and the second voltage signal $V_{OUT2}$ output by the second voltage detecting circuit 42 would stay at low level.

Specifically, as shown in FIG. 4, after the input end of the inverter 431 in the logic circuit 43 receives the first voltage signal $V_{OUT1}$ at high level, the output end of the inverter 431 outputs the first inversing voltage signal $V_{INV\_OUT}$ at low level to the first input end of the OR gate. After that, the first input end of the OR gate receives the first inversing voltage signal $V_{INV\_OUT}$ at low level and the second input end of the OR gate receives the second voltage signal $V_{OUT2}$ at low level such that the output end of the OR gate outputs the control signal $V_{CON}$ at low level for continually turning off the first NMOS transistor NM1 and the second NMOS transistor NM2 in the first voltage detecting circuit 41, which continues to stop the power on reset circuit 4 from detecting the voltage of the power supply VDD. At the same, because the third PMOS transistor PM3 is still turned on, the output signal $V_{POR\_OUT}$ output by the power on reset circuit 4 stays at high level, which represents the period when the operating electric device is turned into its reset status.

Finally, as the voltage of the power supply VDD falls and turns to be less than the falling threshold voltage $V_{TH\_F2}$ of the second voltage detecting circuit 42, the first voltage signal $V_{OUT1}$ output by the first voltage detecting circuit 41 turns to be at low level.

Specifically, as shown in FIG. 4, after the input end of the inverter 431 in the logic circuit 43 receives the first voltage signal $V_{OUT1}$ at low level, the output end of the inverter 431 outputs the first inversing voltage signal $V_{INV\_OUT}$ at high level to the first end of the OR gate. After the first input end of the OR gate receives the first inversing voltage signal $V_{INV\_OUT}$ at high level, the output end of the OR gate outputs the control signal $V_{CON}$ at high level for turning on the first NMOS transistor NM1 and the second NMOS transistor NM2 and turning off the third PMOS transistor PM3 such that the first voltage detecting circuit 41 is turned on and thus the power on reset circuit 4 starts to detect the voltage of the power supply VDD. At the same time, because the third PMOS transistor PM3 is turned off, the output signal $V_{POR\_OUT}$ output by the power on reset circuit 4 turns to be at low level, which represents that the entire circuit of the electric device is switched back to the reset status.

On the other hand, the following description illustrating the situation that the falling threshold voltage $V_{TH\_F2}$ of the second voltage detecting circuit 42 is larger than the falling threshold voltage $V_{TH\_F1}$ of the first voltage detecting circuit 41. If the voltage of the power supply VDD falls from its steady state, during a period that the voltage value of the power supply falls, as the voltage of the power supply VDD is still larger than the falling threshold voltage $V_{TH\_F1}$ of the second voltage detecting circuit 42, the first voltage signal $V_{OUT1}$ output by the first voltage detecting circuit 41 stays at high level and the second voltage signal $V_{OUT2}$ output by the second voltage detecting circuit 42 stays at low level.

Specifically, as shown in FIG. 4, after the input end of the inverter 431 in the logic circuit 43, the output end the inverter 431 outputs a first inversing voltage signal $V_{INV\_OUT}$ at low level to the first input end of the OR gate. After that, the first input end of the OR gate receives the first inversing voltage signal $V_{INV\_OUT}$ at low level and the second input end of the OR gate receives the second voltage signal $V_{OUT2}$ at low level, and thus the output end of the OR gate outputs a control signal $V_{CON}$ at low level for turning off the first NMOS transistor NM1 and the second NMOS transistor NM2 in the first voltage detecting circuit 41 and turning on the third PMOS transistor PM3 in the first voltage detecting circuit 41 so as to continually turn on the first voltage detecting circuit 41. Thus, the power on reset circuit 4 does not detect the voltage of the power supply VDD still. At the same time, because the third PMOS transistor PM3 is turned on, the first voltage signal $V_{OUT1}$ stays at high level such that the output signal $V_{POR\_OUT}$ output by the power on reset circuit 4 stays at high level, which represents that the electric device is still turned on.

After that, as the voltage of the power supply VDD falls to be less than the falling threshold voltage $V_{TH\_F2}$ of the second voltage detecting circuit 42 but still larger than the falling threshold voltage $V_{TH\_F1}$ of the first voltage detecting circuit 41, the second voltage signal $V_{OUT2}$ output by the second voltage detecting circuit 42 would turned to be at high level.

Specifically, as shown in FIG. 4, after the input end of the inverter 431 in the logic circuit 43 receives the first voltage signal $V_{OUT1}$ at high level, the output end of the inverter 431 outputs the first inversing voltage signal $V_{INV\_OUT}$ at low level to the first input end of the OR gate. After that, the first input end of the OR gate receives the first inversing voltage signal $V_{INV\_OUT}$ at low level and the second input end of the OR gate receives the second voltage signal $V_{OUT2}$ at high level, and thus the output end of the OR gate outputs a control signal $V_{CON}$ at high level for turning on the first NMOS transistor NM1 and the second NMOS transistor NM2 in the first voltage detecting circuit 41 and turning off the third PMOS transistor PM3 in the first voltage detecting circuit 41. Thus, the first voltage detecting circuit 41 is turned on and the power on reset circuit again starts to detect the voltage of the power supply VDD. However, at this moment, the third PMOS transistor PM3 is turned off but the first voltage signal $V_{OUT1}$ output by the first voltage detecting circuit 41 stays at high level, so the output signal $V_{POR\_OUT}$ output by the power on reset circuit 4 also stays at high level, which represents that the electric device is about to returning to its reset status.

Finally, as the voltage of the power supply VDD falls to be less than the falling threshold voltage $V_{TH\_F1}$ of the first voltage detecting circuit 41, the first voltage signal $V_{OUT1}$ output by the first voltage detecting circuit 41 turns to be at low level.

Specifically, as shown in FIG. 4, after the input end of the inverter 431 in the logic circuit 43 receives the first voltage signal $V_{OUT1}$ at low level, the output end of the inverter 431 outputs a first inversing voltage signal $V_{INV\_OUT}$ at high level to the first input end of the OR gate. After that, the first input end of the OR gate receives the first inversing voltage signal $V_{INV\_OUT}$ at high level and the second input end of the OR gate receives the second voltage signal $V_{OUT2}$ at low level, so the output end of the OR gate outputs a control signal $V_{CON}$ to continually turn on the first NMOS transistor NM1 and the second NMOS transistor NM2 in the first voltage detecting circuit 41 and to continually turn off the third PMOS transistor PM3 in the first voltage detecting circuit 41. Thus, the first voltage detecting circuit 41 is still turned on and the power on reset circuit 4 continues to detect the voltage of the power supply VDD. However, at this time, the third PMOS transistor PM3 is still turned off and the first voltage signal $V_{OUT1}$ output by the first voltage detecting circuit 41 turns to be at low level, so the output signal $V_{POR\_OUT}$ output by the power on reset circuit 4 also turns to be at low level, which represents that the entire circuit of the electric device has returned to its reset status.

In addition, the power on reset circuit provided by this embodiment can be applied to plenty kinds of electric devices as one of circuits built in the electric devices. For example, the power on reset circuit provided by this embodiment can be built in a computer host, and helps to detect the falling and rising of the power supply for controlling the start-up and reset of the computer host. Moreover, as the power supply is sable, the power on reset circuit provided by this embodiment does not continually detect the voltage of the power supply, which thus helps to reduce the operating cost of the electric device.

[Another Embodiment of the Power on Reset Circuit]

Figure 5:
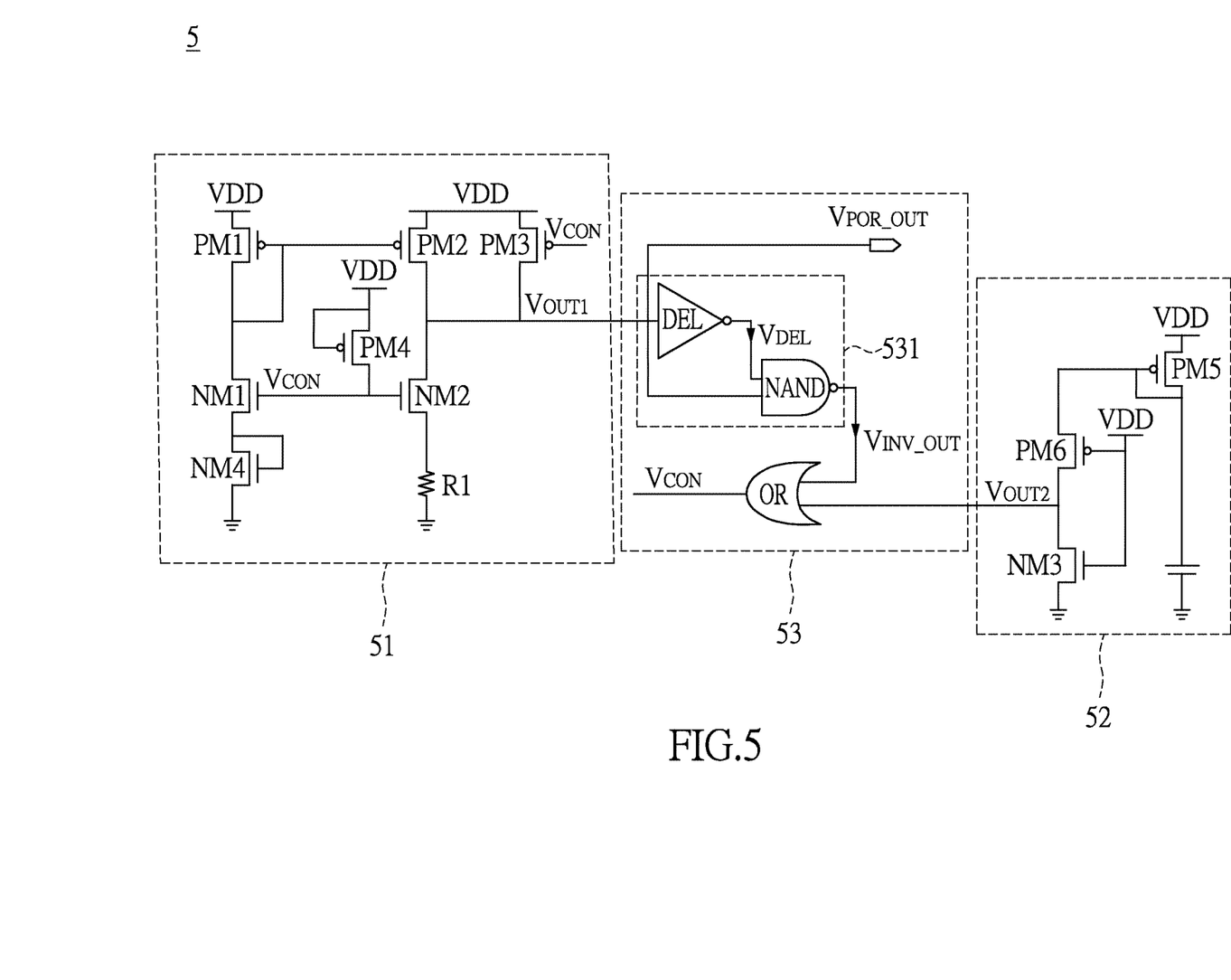
FIG. 5 shows a schematic diagram of a power on reset circuit of another embodiment of the instant disclosure.

Please refer to FIG. 5, FIG. 5 shows a schematic diagram of a power on reset circuit of another embodiment of the instant disclosure. The schematic diagram of the power on reset circuit 5 shown in FIG. 5 is almost the same as to the schematic diagram of the power on reset circuit 4 shown in FIG. 4. As shown in FIG. 5, the differences between the power on reset circuits 4 and 5 shown in FIG. 4 and FIG. 5 are that the first voltage detecting circuit 51 further comprises a fourth PMOS transistor PM4 having source and gate electrically connected to the power supply and having drain electrically connected to gates of the first NMOS transistor NM1 and the first NMOS transistor NM2 as a start-up circuit, and that the inverter 531 in the logic circuit 53 further comprises a delay buffer and a NAND gate. The delay buffer comprises an input end and an output end, wherein the input end is electrically connected to the first voltage detecting circuit 51 for receiving the first voltage signal $V_{OUT1}$ and the output end outputs a first delay voltage signal VDEL. The NAND gate comprises a first input end, a second input end and an output end, wherein the first input end is electrically connected to the output end of the delay buffer, the second input end is electrically connected to the first voltage detecting circuit 51 for receiving the first voltage signal $V_{OUT1}$ and the output end is electrically connected to the first input end of the OR gate for outputting the first inversing voltage signal $V_{INV\_OUT}$ to the OR gate.

It should be noticing that, the circuit structure and working mechanism of the power on reset circuit 5 shown in FIG. 5 and the circuit structure and working mechanism of the power on reset circuit 4 shown in FIG. 4 are almost the same, and this the skilled in the art should be able to understand that the combination of the delay buffer and the NAND gate in this embodiment can be considered the inverter 431 in the embodiment shown in FIG. 4. Thus, the detailed working mechanism of the power on reset circuit 5 shown in FIG. 5 can be referred to the embodiment shown in FIG. 4, and the redundant information is not repeated herein.

In addition, the power on reset circuit provided by this embodiment can be applied to plenty kinds of electric devices as one of circuits built in the electric devices. For example, the power on reset circuit provided by this embodiment can be built in a computer host, and helps to detect the falling and rising of the power supply for controlling the start-up and reset of the computer host. Moreover, as the power supply is sable, the power on reset circuit provided by this embodiment does not continually detect the voltage of the power supply, which thus helps to reduce the operating cost of the electric device.

[One Embodiment of the Power on Reset Method]

Figure 6:
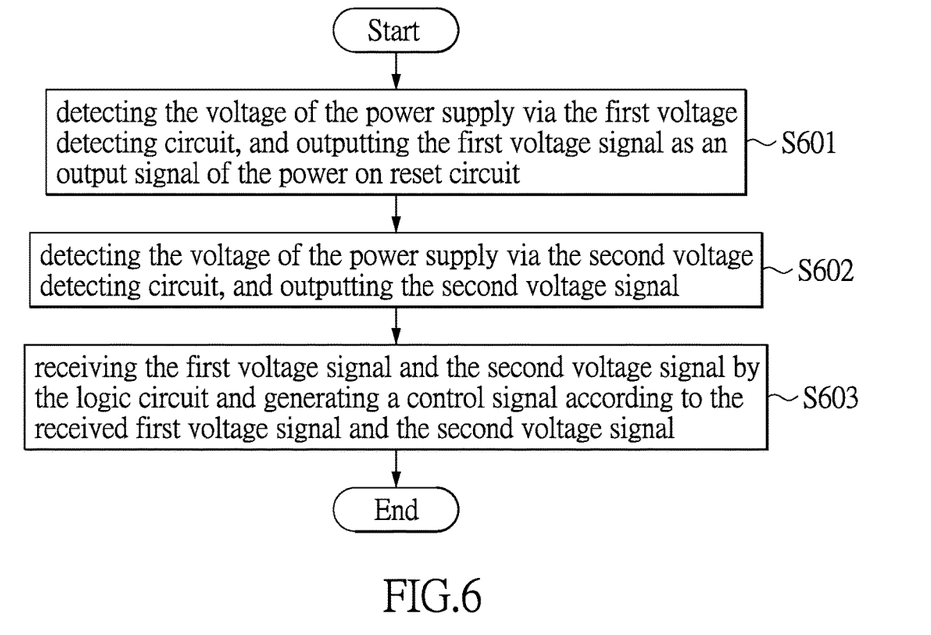
FIG. 6 shows a flow chart of a power on reset method of one embodiment of the instant disclosure.

Please refer to FIG. 6, FIG. 6 shows a flow chart of a power on reset method of one embodiment of the instant disclosure. As shown in FIG. 6, the power on reset method 6 provided by this embodiment comprises steps as below: detecting the voltage of the power supply via the first voltage detecting circuit, and outputting the first voltage signal as an output signal of the power on reset circuit (Step S601); detecting the voltage of the power supply via the second voltage detecting circuit, and outputting the second voltage signal (Step S602); and receiving the first voltage signal and the second voltage signal by the logic circuit and generating a control signal according to the received first voltage signal and the second voltage signal (Step S603), so as to turn on or off the first voltage detecting circuit and further to detect the voltage of the power supply. Moreover, in this embodiment, merely when the voltage value of the power supply is less than a rising threshold voltage value of the first voltage detecting circuit or a falling threshold voltage value of the second voltage detecting circuit, the first voltage detecting circuit is turned on to detect the voltage value of the power supply.

It should be noticing that, the power on reset method 6 is used in the power on reset circuit 4 shown in FIG. 4 and the power on reset circuit 5 shown in FIG. 5. However, the circuit structures and working mechanisms of the power on reset circuit 4 shown in FIG. 4 and the power on reset circuit 5 shown in FIG. 5 are illustrated in details, and the redundant information is not repeated herein.

To sum up, in the power on reset circuit, the power on reset method and the electric device using the same provided by the embodiments of the instant disclosure, the logic circuit controls the first voltage detecting circuit and the second voltage detecting circuit such that the first voltage detecting circuit is turned on to detect the voltage of the power supply merely when the voltage of the power supply is less than the rising threshold voltage of the first voltage detecting circuit or the falling threshold voltage of the second voltage detecting circuit. In other words, in the power on reset circuit, the power on reset method and the electric device using the same provided by the embodiments of the instant disclosure, as the voltage of the power supply has been larger than the rising threshold voltage of the first voltage detecting circuit, the first voltage detecting circuit would automatically stop detecting the voltage of power supply. The first voltage detecting circuit would automatically start again to detect the voltage of power supply when the voltage of the power supply is less than the falling threshold voltage of the second voltage detecting circuit. Comparing with the traditional power on reset circuit that needs to stay alive all time to detect the voltage of the power supply, the instant disclosure reduces the power consumption and thus the operation cost of the electric device can be further decreased.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A power on reset circuit, comprising:
   a first voltage detecting circuit, for detecting the voltage value of a power supply and outputting a first voltage signal as an output signal of the power on reset circuit;
   a second voltage detecting circuit, for detecting the voltage value of the power supply and outputting a second voltage signal; and
   a logic circuit, electrically connected to the first voltage detecting circuit and the second voltage detecting circuit, comprising:
      an inverter, comprising an input end receiving the first voltage signal and an output end outputting a first inverting voltage signal; and
      an OR gate, comprising a first input end, a second input end and an output end, the first input end electrically connected to the output end of the inverter for receiving the first inverting voltage signal, the second input end electrically connected to the second voltage detecting circuit for receiving the second voltage signal, the output end electrically connected to the first voltage detecting circuit for outputting the control signal for turning on or off the first voltage detecting circuit to detect the voltage value of the power supply;
   wherein merely when the voltage value of the power supply is less than a rising threshold voltage value of the first voltage detecting circuit or a falling threshold voltage value of the second voltage detecting circuit, the first voltage detecting circuit is turned on to detect the voltage value of the power supply.

2. The power on reset circuit according to claim 1, wherein the first voltage detecting circuit is a rising and falling edge detecting circuit for detecting whether the voltage value of the power supply rises or falls, and the second voltage detecting circuit is a falling edge detecting circuit for detecting whether the voltage value of the power supply falls.

3. The power on reset circuit according to claim 1, wherein during a period that the voltage value of the power supply rises,
   as the voltage value of the power supply is less than the rising threshold voltage of the first voltage detecting circuit, the first voltage signal and the second voltage signal are at low level; and
   as the voltage value of the power supply is not less than the rising threshold voltage of the first voltage detecting circuit, the first voltage signal is at high level and the second voltage signal is at low level.

4. The power on reset circuit according to claim 1, wherein if a falling threshold voltage of the first voltage detecting circuit is larger than the falling threshold voltage of the second voltage detecting circuit, during a period that the voltage value of the power supply falls,
   as the voltage value of the power supply is larger than the falling threshold voltage of the first voltage detecting circuit, the first voltage signal is at high level and the second voltage signal is at low level;
   as the voltage value of the power supply is less than the falling threshold voltage of the first voltage detecting circuit but larger than the falling threshold voltage of the second voltage detecting circuit, the first voltage signal is at high level and the second voltage signal is at low level; and
   as the voltage value of the power supply is less than the falling threshold voltage of the second voltage detecting circuit but larger than the falling threshold voltage of the second voltage detecting circuit, the first voltage signal is at low level.

5. The power on reset circuit according to claim 1, wherein if a falling threshold voltage of the first voltage detecting circuit is not larger than the falling threshold voltage of the second voltage detecting circuit, during a period that the voltage value of the power supply falls,
   as the voltage value of the power supply is larger than the falling threshold voltage of the second voltage detecting circuit, the first voltage signal is at high level and the second voltage signal is at low level;
   as the voltage value of the power supply is less than the falling threshold voltage of the second voltage detecting circuit but larger than the falling threshold voltage of the first voltage detecting circuit, the first voltage signal and the second voltage signal are at high level; and
   as the voltage value of the power supply is less than the falling threshold voltage of the first voltage detecting circuit, the first voltage signal is at low level.

6. The power on reset circuit according to claim 1, wherein the first voltage detecting circuit comprises:
   a first PMOS transistor, having source electrically connected to the power supply, having gate and drain electrically connected;
   a second PMOS transistor, having source electrically connected to the power supply, having gate electrically connected to gate and drain of the first PMOS transistor;
   a first NMOS transistor, having source electrically connected to a grounding voltage, having gate electrically connected to the logic circuit for receiving the control signal, having drain electrically connected to drain of the first PMOS transistor;

a resistor, having a first end and a second end, the first end and the second end electrically connected to the grounding voltage;

a second NMOS transistor, having source electrically connected to the first end of the resistor, having gate electrically connected to the logic circuit for receiving the control signal, having drain electrically connected to drain of the second PMOS transistor and the logic circuit for outputting the first voltage signal to the logic circuit; and a third PMOS transistor, having source electrically connected to the power supply, having gate electrically connected to the logic circuit for receiving, having drain electrically connected to drain of the second PMOS transistor and the logic circuit for outputting the first voltage signal to the logic circuit.

7. The power on reset circuit according to claim 6, wherein the second voltage detecting circuit comprises:

a fifth PMOS transistor, having source electrically connected to the power supply, having drain and gate electrically connected;

a capacitor, having a first end and a second end, the first end electrically connected to drain and gate of the fifth PMOS transistor, the second end electrically connected to a grounding voltage;

a sixth PMOS transistor, having source electrically connected to gate of the fifth PMOS transistor, having gate electrically connected to the power supply, having drain electrically connected to the logic circuit for outputting the second voltage signal to the logic circuit; and a third NMOS transistor, having source electrically connected to the grounding voltage, having gate electrically connected to the power supply, having drain electrically connected to drain of the sixth PMOS transistor and the logic circuit for outputting the second voltage signal to the logic circuit.

8. The power on reset circuit according to claim 7, wherein during a period that the voltage value of the power supply rises, as the voltage value of the power supply is less than the rising threshold voltage of the first voltage detecting circuit, the first voltage detecting circuit and the second voltage detecting circuit respectively outputs the first voltage signal and the second voltage signal at low level to the logic circuit, such that the logic circuit outputs the control signal at high level for turning off the third PMOS transistor and turning on the first NMOS transistor and the second NMOS transistor, so as to turn on the first voltage detecting circuit and detect the voltage value of the power supply; and as the voltage value of the power supply is larger than or equal to the rising threshold voltage of the first voltage detecting circuit, the first voltage detecting circuit outputs the first voltage signal at high level to the logic circuit and the second voltage detecting circuit outputs the second voltage signal at low level to the logic circuit, such that the logic circuit outputs the control signal at low level for turning off the first NMOS transistor and the second NMOS transistor and turning on the third PMOS transistor, so as to turn off the first voltage detecting circuit, stop detecting the voltage value of the power supply and maintain the first voltage signal at high level.

9. The power on reset circuit according to claim 7, wherein if a falling threshold voltage of the first voltage detecting circuit is larger than the falling threshold voltage of the second voltage detecting circuit, during a period that the voltage value of the power supply falls, as the voltage value of the power supply is larger than the falling threshold voltage of the first voltage detecting circuit, the first voltage detecting circuit outputs the first voltage signal at high level to the logic circuit and the second voltage detecting circuit outputs the second voltage signal at low level to the logic circuit, such that the logic circuit outputs the control signal at low level for turning off the first NMOS transistor and the second NMOS transistor and turning on the third PMOS transistor, so as to turn off the first voltage detecting circuit, stop detecting the voltage value of the power supply and maintain the first voltage signal at high level;

as the voltage value of the power supply is less than the falling threshold voltage of the first voltage detecting circuit but larger than the falling threshold voltage of the second voltage detecting circuit, the first voltage detecting circuit continually outputs the first voltage signal at high level to the logic circuit and the second voltage detecting circuit outputs the second voltage signal at low level to the logic circuit, such that the logic circuit outputs the control signal at low level for turning off the first NMOS transistor and the second NMOS transistor and turning on the third PMOS transistor, so as to turn off the first voltage detecting circuit, stop detecting the voltage value of the power supply and maintain the first voltage signal at high level; and as the voltage value of the power supply is less than the falling threshold voltage of the second voltage detecting circuit, the first voltage detecting circuit outputs the first voltage signal at low level to the logic circuit, such that the logic circuit outputs the control signal at high level for turning off the third PMOS transistor and turning on the first NMOS transistor and the second NMOS transistor, so as to turn on the first voltage detecting circuit for detecting the voltage value of the power supply and outputting the first voltage signal at low level.

10. The power on reset circuit according to claim 7, wherein if a falling threshold voltage of the first voltage detecting circuit is less than the falling threshold voltage of the second voltage detecting circuit, during a period that the voltage value of the power supply falls, as the voltage value of the power supply is larger than the falling threshold voltage of the second voltage detecting circuit, the first voltage detecting circuit outputs the first voltage signal at high level to the logic circuit and the second voltage detecting circuit outputs the second voltage signal at low level to the logic circuit, such that the logic circuit outputs the control signal at low level for turning off the first NMOS transistor and the second NMOS transistor and turning on the third PMOS transistor, so as to turn off the first voltage detecting circuit, stop detecting the voltage value of the power supply and maintain the first voltage signal at high level;

as the voltage value of the power supply is less than the falling threshold voltage of the second voltage detecting circuit but larger than the falling threshold voltage of the first voltage detecting circuit, the first voltage detecting circuit continually outputs the first voltage signal at high level to the logic circuit and the second voltage detecting circuit outputs the second voltage signal at high level to the logic circuit, such that the logic circuit outputs the control signal at high level for turning on the first NMOS transistor and the second NMOS transistor and turning off the third PMOS transistor, so as to turn on the first voltage detecting circuit and start to detect the voltage value of the power supply; and as the voltage value of the power supply is less than the falling threshold voltage of the first voltage detecting circuit, the first voltage detecting circuit outputs the first voltage signal at low level, such that the logic circuit outputs the control signal at high level for turning on the first NMOS transistor and the second NMOS transistor, so as to turn on the first voltage detecting circuit for detecting the voltage value of the power supply.

11. The power on reset circuit according to claim 6, wherein the first voltage detecting circuit further comprises:

a fourth PMOS transistor, having source and gate electrically connected to the power supply, having drain electrically connected to gates of the first NMOS transistor and the second NMOS transistor, for being as a start-up circuit.

12. The power on reset circuit according to claim 1, wherein the inverter comprises:

a delay buffer, having an input end electrically connected to the first voltage detecting circuit for receiving the first voltage signal and an output end for outputting a first delay voltage signal; and a NAND gate, having a first input end, a second input end and an output end, the first input end electrically connected to the output end of the delay buffer, the second input end electrically connected to the first voltage detecting circuit for receiving the first voltage signal, the output end electrically connected to the first input end of the OR gate for outputting the first inverting voltage signal to the OR gate.

13. A power on reset method, used in a power on reset circuit according to claim 1, the power on reset method comprising:

detecting a voltage value of a power supply via the first voltage detecting circuit and outputting a first voltage signal as an output signal of the power on reset circuit;

detecting the voltage value of the power supply via the second voltage detecting circuit and outputting a second voltage signal; and receiving the first voltage signal and the second voltage signal via the logic circuit, and generating a control signal according to the receive first voltage signal and second voltage signal, wherein the control signal is used to turn on or off the first voltage detecting circuit so as to detect the voltage value of the power supply;

wherein merely when the voltage value of the power supply is less than a rising threshold voltage value of the first voltage detecting circuit or a falling threshold voltage value of the second voltage detecting circuit, the first voltage detecting circuit is turned on to detect the voltage value of the power supply.

14. The power on reset method according to claim 13, wherein the first voltage detecting circuit is a rising and falling edge detecting circuit for detecting whether the voltage value of the power supply rises or falls, and the second voltage detecting circuit is a falling edge detecting circuit for detecting whether the voltage value of the power supply falls.

15. The power on reset method according to claim 13, wherein during a period that the voltage value of the power supply rises, as the voltage value of the power supply is less than the rising threshold voltage of the first voltage detecting circuit, the first voltage signal and the second voltage signal are at low level; and as the voltage value of the power supply is not less than the rising threshold voltage of the first voltage detecting circuit, the first voltage signal is at high level and the second voltage signal is at low level.

16. The power on reset method according to claim 13, wherein if a falling threshold voltage of the first voltage detecting circuit is larger than the falling threshold voltage of the second voltage detecting circuit, during a period that the voltage value of the power supply falls, as the voltage value of the power supply is larger than the falling threshold voltage of the first voltage detecting circuit, the first voltage signal is at high level and the second voltage signal is at low level;

as the voltage value of the power supply is less than the falling threshold voltage of the first voltage detecting circuit but larger than the falling threshold voltage of the second voltage detecting circuit, the first voltage signal is at high level and the second voltage signal is at low level; and as the voltage value of the power supply is less than the falling threshold voltage of the second voltage detecting circuit but larger than the falling threshold voltage of the second voltage detecting circuit, the first voltage signal is at low level.

17. The power on reset method according to claim 13, wherein if a falling threshold voltage of the first voltage detecting circuit is not larger than the falling threshold voltage of the second voltage detecting circuit, during a period that the voltage value of the power supply falls, as the voltage value of the power supply is larger than the falling threshold voltage of the second voltage detecting circuit, the first voltage signal is at high level and the second voltage signal is at low level;

as the voltage value of the power supply is less than the falling threshold voltage of the second voltage detecting circuit but larger than the falling threshold voltage of the first voltage detecting circuit, the first voltage signal and the second voltage signal are at high level; and as the voltage value of the power supply is less than the falling threshold voltage of the first voltage detecting circuit, the first voltage signal is at low level.

18. An electric device, comprising a plurality of circuits, wherein at least one of the circuits is a power on reset circuit according to claim 1.

* * * * *